United States Patent
Tanaka

(10) Patent No.: US 10,583,493 B2
(45) Date of Patent: Mar. 10, 2020

(54) COATED CUTTING TOOL

(71) Applicant: TUNGALOY CORPORATION, Fukushima (JP)

(72) Inventor: Shigeki Tanaka, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 198 days.

(21) Appl. No.: 15/568,948

(22) PCT Filed: Apr. 25, 2016

(86) PCT No.: PCT/JP2016/062912
§ 371 (c)(1),
(2) Date: Oct. 24, 2017

(87) PCT Pub. No.: WO2016/175166
PCT Pub. Date: Nov. 3, 2016

(65) Prior Publication Data
US 2018/0117680 A1    May 3, 2018

(30) Foreign Application Priority Data
Apr. 27, 2015 (JP) .................. 2015-090394

(51) Int. Cl.
*B23B 27/14* (2006.01)
*B23C 5/16* (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
USPC .............. 428/216, 336, 325, 697, 698, 699; 51/307, 309
See application file for complete search history.

(56) References Cited

U.S. PATENT DOCUMENTS

2007/0269610 A1  11/2007  Fukui et al.
2009/0060669 A1   3/2009  Astrand et al.
2014/0193623 A1   7/2014  Setoyama et al.

FOREIGN PATENT DOCUMENTS

| JP | H07-097679 A | | 4/1995 |
| JP | 2010-207916 | * | 9/2010 |
| KR | 10-2015-0043264 A | | 4/2015 |

OTHER PUBLICATIONS

International Preliminary Report on Patentability and Written Opinion issued in PCT/JP2016/062912 dated Oct. 31, 2017.
(Continued)

*Primary Examiner* — Archene A Turner
(74) *Attorney, Agent, or Firm* — Studebaker & Brackett PC

(57) ABSTRACT

A coated cutting tool includes a coating layer formed on a substrate. The coating layer includes an alternating laminate structure of two or more compound layers of each of two or more different compositions. One layer contains a compound having a composition $(Al_xM_{1-x})N$, where atomic ratio x is 0.58 to 0.90; and another layer contains a compound having a composition $(Al_yM_{1-y})N$, where atomic ratio y is 0.57 to 0.79. M is an element of at least one kind selected from Groups 4, 5, and 6 elements and Si. An absolute value of a difference between amounts of a specific metal element in the compound layers relative to amounts of the metal element respectively contained therein is between 0 and 5 atom %. An average thickness of each compound layer is from 1 to 50 nm. An average thickness of the alternating laminate structure is from 1.5 to 15 μm.

14 Claims, 1 Drawing Sheet

(51) Int. Cl.
*B23B 51/00* (2006.01)
*C23C 28/04* (2006.01)
*C23C 28/00* (2006.01)
*C23C 14/06* (2006.01)

(52) U.S. Cl.
CPC ........ *C23C 14/0641* (2013.01); *C23C 28/042* (2013.01); *C23C 28/044* (2013.01); *C23C 28/42* (2013.01); *B23B 2224/08* (2013.01)

(56) References Cited

OTHER PUBLICATIONS

International Search Report issued in PCT/JP2016/062912; dated May 24, 2016.

\* cited by examiner

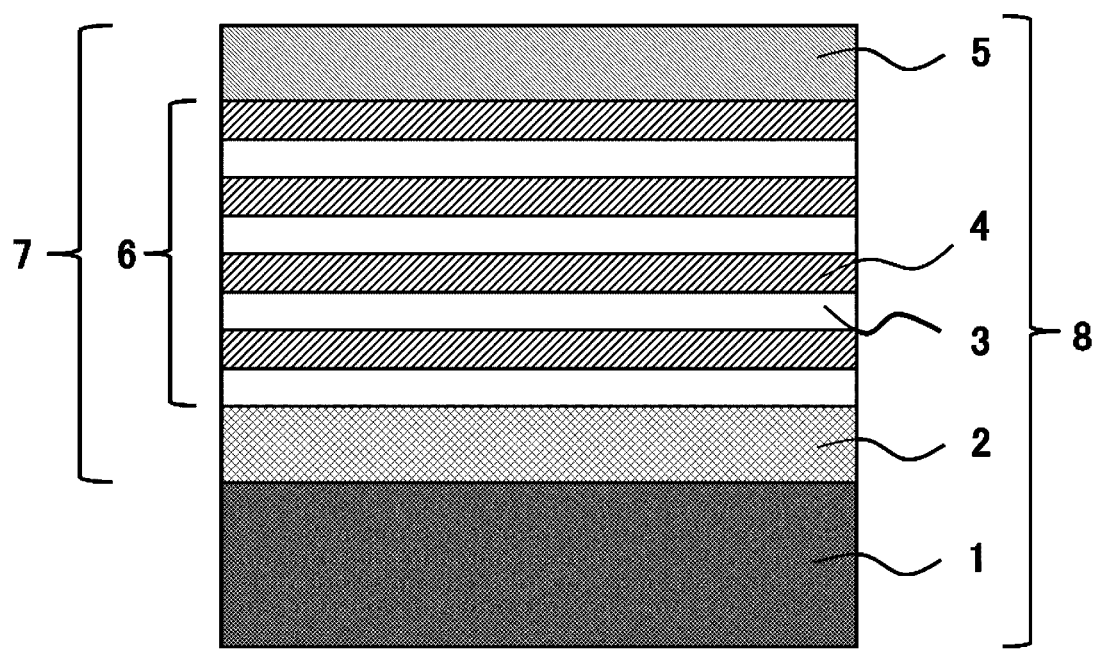

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with the improvement of highly efficient cutting. Thus, in terms of the performance required for tool materials, improvements of wear resistance and fracture resistance, which are directly related to the tool life, have been becoming increasingly important. In view of this, in order to improve such characteristics, a coated cutting tool is used in which coatings of two kinds are laminated in an alternating manner on a surface of a substrate.

Various techniques have been proposed in order to improve the characteristics of the above-described coatings of two kinds which are laminated in an alternating manner on a surface of a cutting tool. For example, Patent Document 1 proposes a coated cutting tool in which: compounds of two kinds, i.e., $Ti_xAl_{1-x}N$ and $Ti_yAl_{1-y}N$ ($0 \leq x < 0.5$, $0.5 < y \leq 1$) are laminated in an alternating manner; and the resulting laminate is aluminum rich in its entirety.

CITATION LIST

Patent Documents

Patent Document 1: JPH07-097679 A

SUMMARY

Technical Problem

While there has been a trend in which cutting conditions are severe, compared with the prior art, in order to increase machining efficiency, a longer tool life than so far has been demanded. In the machining of difficult-to-machine materials with low thermal conductivity, such as a nickel-based heat-resistant alloy and a cobalt-based heat-resistant alloy, a coating included in a cutting edge is prone to be decomposed and oxidized due to the generation of heat during cutting. Therefore, the reduction in hardness of such coating and the embrittlement thereof tend to invite the occurrence of fractures in the tool.

The invention of Patent Document 1 involves a layer containing a higher ratio of Ti than that of Al, and this leads to a problem in that the oxidation resistance of a cutting tool cannot be sufficiently secured. Further, since layers each containing a high ratio of Ti and layers each containing a high ratio of Al are laminated in an alternating manner, the lattice strain of the laminate is increased. Therefore, if the hardness of the laminate is increased, the residual compressive stress is also increased, whereby fracturing is prone to occur. In particular, in the machining of difficult-to-machine materials, the residual stress greatly affects fracture resistance.

The present invention has been made in light of the above circumstances, and an object of the present invention is to provide a coated cutting tool which has excellent fracture resistance and allows for satisfactory machining over a long period of time, particularly in the machining of difficult-to-machine materials with low thermal conductivity.

Solution to Problem

The present inventor has conducted studies regarding the extension of the tool life of a coated cutting tool and has then found that the following configurations of a coated cutting tool allow the fracture resistance thereof to be improved, and found that, as a result, the tool life of the coated cutting tool can be extended, and this has led to the completion of the present invention.

Namely, the gist of the present invention is as set forth below.

(1) A coated cutting tool comprising a substrate and a coating layer formed on a surface of the substrate, the coating layer including an alternating laminate structure in which two or more compound layers of each of two or three or more kinds, each kind having a different composition, are laminated in an alternating manner, wherein:

the alternating laminate structure is constituted by:

a compound layer containing a compound having a composition represented by formula (1) below:

$$(Al_xM_{1-x})N \quad (1)$$

[wherein M denotes an element of at least one kind selected from the group consisting of Ti, Zr, Hf, V, Nb, Ta, Cr, Mo, W and Si, x denotes an atomic ratio of the Al element based on a total of the Al element and an element denoted by M, and x satisfies $0.58 \leq x \leq 0.80$]; and a compound layer containing a compound having a composition represented by formula (2) below:

$$(Al_yM_{1-y})N \quad (2)$$

[wherein M denotes an element of at least one kind selected from the group consisting of Ti, Zr, Hf, V, Nb, Ta, Cr, Mo, W and Si, y denotes an atomic ratio of the Al element based on a total of the Al element and an element denoted by M, and y satisfies $0.57 \leq x \leq 0.79$];

an absolute value of a difference between an amount of a specific metal element contained in a compound layer which constitutes the alternating laminate structure relative to an amount of all the metal elements contained therein and an amount of the specific metal element contained in another compound layer which is adjacent to the compound layer and which constitutes the alternating laminate structure relative to an amount of all the metal elements contained therein, is more than 0 atom % and less than 5 atom %; and an average thickness of each of the compound layers is from 1 nm or more to 50 nm or less, and an average thickness of the alternating laminate structure is from 1.5 μm or more to 15.0 μm or less.

(2) The coated cutting tool of (1), wherein the absolute value is from 1 atom % or higher to 4 atom % or lower.

(3) The coated cutting tool of (1) or (2), wherein an average grain size of the alternating laminate structure is from 100 nm or more to 450 nm or less.

(4) The coated cutting tool of any of (1) to (3), wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

(5) The coated cutting tool of any of (1) to (4), wherein:
the coating layer includes an upper layer on a surface of the alternating laminate structure;

the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

(6) The coated cutting tool of any of (1) to (5), wherein an average thickness of the coating layer in its entirety is from 1.5 μm or more to 15 μm or less.

(7) The coated cutting tool of any of (1) to (6), wherein the substrate is a cemented carbide, cermet, ceramics or a cubic boron nitride sintered body.

Advantageous Effects of Invention

The present invention can provide a coated cutting tool which has excellent fracture resistance and allows for satisfactory machining over a long period of time, particularly in the machining of difficult-to-machine materials with low thermal conductivity.

BRIEF DESCRIPTION OF DRAWINGS

FIG. 1 is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention.

A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of any of a cemented carbide, cermet, ceramics and a cubic boron nitride sintered body because further excellent wear resistance and fracture resistance can be provided.

The coated cutting tool of the present embodiment shows the tendency of wear resistance being further improved if the average thickness of the entire coating layer is 1.5 μm or more. Meanwhile, such coated cutting tool shows the tendency of fracture resistance being further improved if the average thickness of the entire coating layer is 15 μm or less. Thus, the average thickness of the entire coating layer is preferably from 1.5 μm or more to 15 μm or less. In particular, from the same perspective as that set forth above, the average thickness of the entire coating layer is more preferably from 1.5 μm or more to 6.5 μm or less.

The coating layer of the present embodiment includes an alternating laminate structure in which two or more compound layers of each of two or three or more kinds, each kind having a different composition, are laminated in an alternating manner. If the coating layer includes such alternating laminate structure, this leads to an increased hardness of the coating layer, resulting in an improvement of wear resistance. The alternating laminate structure of the present embodiment may be a structure in which two or more compound layers of each of two kinds, each kind having a different composition, are laminated in turn, or may be a structure in which two or more compound layers of each of three kinds, each having a different composition, are laminated in turn. In the specification, the term "having a different composition" means that, as to two compound layers, the difference between the amount (unit: atom %) of a specific metal element contained in one of the compound layers relative to an amount of all the metal elements contained therein and the amount (unit: atom %) of the specific metal element contained in the other compound layer relative to an amount of all the metal elements contained therein, is more than 0 atom %. Thus, for example, when a difference between amounts of a metal element is 0.4 atom %, this does not fall under "having a different composition," but when such difference is 0.5 atom %, this does fall under "having a different composition." The above "specific element" may be any of the metal elements contained in either of the compound layers, and an Si element is encompassed by a metal element.

One kind of the compound layers which constitute the alternating laminate structure of the present embodiment is a layer containing a compound having the composition represented by formula (1) below and is preferably comprised of a layer consisting of such compound.

$$(Al_xM_{1-x})N \quad (1)$$

Herein, in formula (1), M denotes an element of at least one kind selected from the group consisting of Ti, Zr, Hf, V, Nb, Ta, Cr, Mo, W and Si, x denotes an atomic ratio of the Al element based on a total of the Al element and an element represented by M, and x satisfies $0.58 \leq x \leq 0.80$. If the atomic ratio (x) of the Al element in this compound layer is 0.58 or more, this leads to a large content of Al, thereby allowing the reduction in oxidation resistance to be further suppressed together with the effect based on an atomic ratio (y) of the Al element in a compound layer having the composition represented by formula (2) below, whereas, if the atomic ratio (x) of the Al element is 0.80 or less, this leads to a further reduced existence ratio of hexagonal crystals, thereby allowing the reduction in wear resistance to be further suppressed together with the effect based on the atomic ratio (y) of the Al element in a compound layer having the composition represented by formula (2) below. From the same perspective, x preferably satisfies $0.60 \leq x \leq 0.80$ and more preferably satisfies $0.65 \leq x \leq 0.75$.

Further, another kind of the compound layers which constitute the alternating laminate structure of the present embodiment is a layer containing a compound having the composition represented by formula (2) below and is preferably comprised of a layer consisting of such compound.

$$(Al_yM_{1-y})N \quad (2)$$

Herein, in formula (2), M denotes an element of at least one kind selected from the group consisting of Ti, Zr, Hf, V, Nb, Ta, Cr, Mo, W and Si, y denotes an atomic ratio of the Al element based on a total of the Al element and an element represented by M, and y satisfies $0.57 \leq x \leq 0.79$. If the atomic ratio of the Al element in this compound layer is 0.57 or more, this leads to a large content of Al, thereby allowing the reduction in oxidation resistance to be further suppressed, whereas, if the atomic ratio of the Al element is 0.80 or less, this leads to a further reduced existence ratio of hexagonal crystals, thereby allowing the reduction in wear resistance to be further suppressed. From the same perspective, y preferably satisfies 0.58≤y≤0.77 and more preferably satisfies 0.63≤y≤0.71.

Moreover, if the element denoted by M which constitutes the compound layer is at least one kind selected from the group consisting of Ti, Zr, Hf, V, Nb, Ta, Cr, Mo, W and Si, this further improves wear resistance. From the same perspective, the element represented by M which constitutes the compound layer is preferably at least one kind selected from the group consisting of Ti, Zr, Hf, Nb, Ta, Cr and Si.

It is preferable that: at least part of the kinds of the metal elements contained in a compound layer which constitutes the alternating laminate structure of the present embodiment is in common with another compound layer which constitutes the alternating laminate structure, and it is more preferable that all of the kinds of the metal elements contained in a compound layer which constitutes the alternating laminate structure of the present embodiment are in common with another compound layer which constitutes the alternating laminate structure. In other words, each of the plurality of compound layers which constitute the alternating laminate structure is more preferably constituted by the same kinds of metal elements. Further, the absolute value of the difference between the amount (unit: atom %) of a specific metal element contained in a compound layer which constitutes the alternating laminate structure relative to the amount of all the metal elements contained therein and the amount (unit: atom %) of the specific metal element contained in another compound layer which is adjacent to the above compound layer and which constitutes the alternating laminate structure relative to the amount of all the metal elements contained therein (hereinafter also referred to as an "absolute value of a composition difference"), is more than 0 atom % and less than 5 atom %. That is, the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is more than 0 atom % and less than 5 atom %. The "ratio of a specific metal element" refers to a ratio (unit: atom %) of the number of atoms of a specific metal element contained in a compound layer relative to the number of atoms of all the metal elements contained in the compound layer. Further, a "specific metal element" may be at least one kind of the metal elements contained in a compound layer, but, with regard to each of the metal elements contained in the compound layer, the above absolute value preferably satisfies the above-described relationship.

Such configuration of the alternating laminate structure does not lead to a reduction in the adhesion between a compound layer which constitutes the alternating laminate structure and another compound layer which is adjacent to the compound layer, thereby resulting in a low degree of mismatching of crystal lattices in the interface between the two compound layers. Thus, the residual compressive stress of the alternating laminate structure can be prevented from being increased, whereby fracture resistance is improved in the machining of difficult-to-machine materials. In particular, the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is preferably from 1 atom % or higher to 4 atom % or lower.

It should be noted that the feature in which the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is 0 atom % indicates a single layer. A single layer has a hardness lower than that of the alternating laminate structure and is therefore inferior in wear resistance.

In the present embodiment, when the composition of a compound layer is represented by $(Al_{0.60}Ti_{0.40})N$, such representation indicates that the atomic ratio of the Al element based on a total of the Al element and the Ti element is 0.60 and that the atomic ratio of the Ti element based on a total of the Al element and the Ti element is 0.40. That is, such representation indicates that the amount of the Al element, being a specific metal element, based on the amount of all the metal elements, i.e., the Al element and the Ti element, is 60 atom % and that the amount of the Ti element, being a specific metal element, based on the amount of all the metal elements, i.e., the Al element and the Ti element, is 40 atom %.

Regarding the above feature in which "the absolute value of the difference between the ratio of a specific metal element contained in a compound layer and the ratio of the specific metal element contained in another compound layer which is adjacent to the compound layer, is more than 0 atom % and less than 5 atom %." For example, when the alternating laminate structure is constituted by a $(Al_{0.67}Ti_{0.33})N$ layer and a $(Al_{0.70}Ti_{0.30})N$ layer, the two compound layers contain the same kinds of metal elements. This is because the two compound layers each contain the Al element and the Ti element as metal elements. In such case, the number of atoms of the Al element contained in the $(Al_{0.67}Ti_{0.33})N$ layer constitutes 67 atom % based on the number of atoms of all the metal elements. The number of atoms of the Al element contained in the $(Al_{0.70}Ti_{0.30})N$ layer constitutes 70 atom % based on the number of atoms of all the metal elements. The difference in the ratio of the number of atoms of the Al element between the above two compound layers is 3 atom %. Therefore, this case satisfies the above condition that "the absolute value of the difference . . . is more than 0 atom % and less than 5 atom %."

Further, for example, when the alternating laminate structure is constituted by a $(Al_{0.65}Ti_{0.30}Cr_{0.05})N$ layer and a $(Al_{0.68}Ti_{0.29}Cr_{0.03})N$ layer, the two compound layers contain the same kinds of metal elements. This is because the two compound layers each contain the Al element, the Ti element and the Cr element as metal elements. In such case, the difference in the ratio of the number of atoms of the Ti element between the two compound layers is 1 atom %. The difference in the ratio of the number of atoms of the Cr element between the two compound layers is 2 atom %. These values are each less than 5 atom %. Moreover, the difference in the ratio of the number of atoms of Al between the two compound layers is 3 atom %. Therefore, this case satisfies the above condition that "the absolute value of the difference . . . is more than 0 atom % and less than 5 atom %."

In the present embodiment, when one compound layer of each of two kinds, each kind having a different composition, is formed, the "number of repeats" is one. FIG. 1 is a schematic view showing an example of a cross-sectional structure of the coated cutting tool of the present invention, and this will be used below in order to describe the number of repeats. This coated cutting tool 8 includes a substrate 1 and a coating layer 7 formed on a surface of the substrate 1. The coating layer 7 is obtained by laminating a lower layer 2, which will be described below, an alternating laminate structure 6, and an upper layer 5, which will be described below, in order from the substrate 1 side. The alternating laminate structure 6 is obtained by laminating, in an alternating manner, respective compound layers, i.e., an A layer 3 and a B layer 4, whose composition is different from that of the A layer 3, in order from the lower layer 2 side to the upper layer 5 side, and the resulting laminate includes four A layers 3 and four B layers 4. In such case, the number of repeats is four. Further, for example, when forming five A layers 3 and five B layers 4, i.e., an A layer 3, a B layer 4, an A layer 3, a B layer 4, an A layer 3, a B layer 4, an A layer 3, a B layer 4, an A layer 3, a B layer 4, in order from the lower layer 2 side to the upper layer 5 side, the number of repeats is five. Herein, the A layer 3 may be a compound layer containing a compound having the composition represented by formula (1) above, and the B layers 4 may be a compound layer containing a compound having the composition represented by formula (2) above. Alternatively, the A layer 3 may be a compound layer containing a compound having the composition represented by formula (2) above, and the B layer 4 may be a compound layer containing a compound having the composition represented by formula (1) above. Although, in FIG. 1, the coating layer 7 includes both the lower layer 2 and the upper layer 5, the coating layer may instead include only either one of the lower layer 2 and the upper layer 5, or include neither of such two layers.

According to another aspect of the present embodiment, description will be simply made below regarding a coated cutting tool having an alternating laminate structure constituted by compound layers of three kinds, each having a different composition. In such coated cutting tool, the alternating laminate structure further includes, in addition to the above A layer and B layer, a C layer, being a compound layer, whose composition is different from those of the above compound layers. The A layer is regarded as being served by a compound layer containing a compound having the composition represented by formula (1) above, and the B layer is regarded as being served by a compound layer containing a compound having the composition represented by formula (2) above. In such case, the order of laminating between the A, B and C layers is not particularly limited, and, for example, any of the following orders from the substrate side may be employed: the order of an A layer, a B layer and a C layer; the order of a B layer, an A layer and a C layer; the order of an A layer, a C layer and a B layer; the order of a B layer, a C layer and an A layer; the order of a C layer, an A layer and a B layer; and the order of a C layer, a B layer and an A layer. The C layer is located between the A layer and the B layer, and thus, from the perspective of improving the adhesion between the A layer and the B layer, the C layer preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B. In particular, as to the C layer, it is preferable that at least part of the kinds of the metal elements contained therein is in common with one compound layer out of the A layer and the B layer, and it is more preferable that all the kinds of the metal elements contained therein are in common with one compound layer out of the A layer and the B layer. Further, the C layer preferably contains a specific metal element at a ratio between the ratio of the specific metal element contained in the A layer and the ratio of the specific metal element contained in the B layer. The above features allow for reduced mismatching of crystal lattices in the interface between adjacent compound layers without a reduction in the adhesion between such compound layers. Thus, the residual compressive stress of the alternating laminate structure can be prevented from being increased, whereby fracture resistance is improved in the machining of difficult-to-machine materials.

Moreover, according to still another aspect of the present embodiment, an alternating laminate structure may include, in addition to the above A layer, B layer and C layer, another one kind or two or more kinds of compound layer(s) whose composition(s) is(are) different from those of the above compound layers. It should be noted, however, that, in the case of such alternating laminate structure, compound layers are preferably laminated such that the A layer and the B layer are adjacent to each other. The compound layers of the other one kind or two or more kinds whose composition(s) is(are) different from those of the A, B and C layers are layers each having a different composition, and such compound layers each preferably contain a compound of: an element of at least one kind selected from the group consisting of Ti, Zr, Hf, V, Nb, Ta, Cr, Mo, W, Al, Si and Y; and an element of at least one kind selected from the group consisting of C, N, O and B, from the perspective of improving the adhesion between the A layer, the B layer and the C layer. In such case, in particular, as to each of the compound layers other than the A layer and the B layer, it is preferable that at least part of the kinds of the metal elements contained therein is in common with one compound layer out of the A layer and the B layer, and it is more preferable that all the kinds of the metal elements contained therein are in common with one compound layer out of the A layer and the B layer. Further, each of the compound layers other than the A layer and the B layer preferably contains a specific metal element at a ratio between the ratio of the specific metal element contained in one of the two kinds of compound layer sandwiching such compound layer and the ratio of the specific element contained in the compound layer of the other kind. The above features allow for reduced mismatching of crystal lattices in the interface between adjacent compound layers without a reduction in the adhesion between such compound layers. Thus, the residual compressive stress of the alternating laminate structure can be prevented from being increased, whereby fracture resistance is improved in the machining of difficult-to-machine materials.

If the average thickness of each of the compound layers which constitute the alternating laminate structure of the present embodiment is 1 nm or more, it becomes easier to form compound layers each having a uniform thickness. Meanwhile, if the average thickness of each of the compound layers which constitute the alternating laminate structure is 50 nm or less, this leads to further increased hardness of the alternating laminate structure. Therefore, the average thickness of a compound layer which constitutes the alternating laminate structure is from 1 nm or more to 50 nm or less, is preferably from 2 nm or more to 50 nm or less, and is more preferably from 4 nm or more to 50 nm or less.

In the present embodiment, if the average thickness of the alternating laminate structure is 1.5 µm or more, wear resistance is further improved, and, if such average thickness is 15 μm or less, fracture resistance is further improved. Thus, the average thickness of the alternating laminate structure is from 1.5 μm or more to 15.0 μm or less. In particular, the average thickness of the alternating laminate structure is preferably from 1.5 μm or more to 6.0 μm or less.

In the present embodiment, if the average grain size of the alternating laminate structure is 100 nm or more, this allows the reduction in wear resistance to be further suppressed, and if such grain size is 450 μm or less, this allows the reduction in fracture resistance to be further suppressed. Thus, the average grain size of the alternating laminate structure is preferably from 100 nm or more to 450 nm or less, and is more preferably from 105 nm or more to 430 nm or less.

The average grain size of the alternating laminate structure in the present embodiment can be measured from a cross-sectional structure in a direction orthogonal to a surface of a substrate in a coated cutting tool (i.e., a cross-sectional structure viewed from the direction shown in FIG. 1), using a transmission electron microscope (TEM). More specifically, a cross-sectional structure of the coated cutting tool is observed with the TEM, and an image magnified 10,000 to 80,000 times is taken. A line (with a width equal to 200 nm) parallel with the substrate surface is drawn on the taken image. At this time, such line is drawn so as to traverse the structure of the alternating laminate structure. The value obtained by dividing the length (diameter) of the particles included in the line by the number of particles contained on the line is regarded as a grain size of the alternating laminate structure. Grain sizes of the alternating laminate structure are measured respectively from the lines drawn at five or more locations, and the arithmetic mean of the obtained values is defined as an average grain size of the alternating laminate structure.

The coating layer of the present embodiment may be comprised of the alternating laminate structure alone. However, it is preferable for a lower layer to be provided between the substrate and the alternating laminate structure (i.e., located as a layer below the alternating laminate structure) because the adhesion between the substrate and the alternating laminate structure is further improved. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti and Al; and an element of at least one kind selected from the group consisting of C, N, O and B, and further preferably contains a compound of: an element of at least one kind selected from the group consisting of Ti and Al; and an N element. It should be noted, however, that the lower layer is different from the compound layers in the alternating laminate structure in terms of their respective compositions. Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer being further improved. From the same perspective, the average thickness of the lower layer is more preferably from 0.1 μm or more to 3.0 μm or less, and is further preferably from 0.1 μm or more to 2.5 μm or less.

The coating layer of the present embodiment may have an upper layer on a side of the alternating laminate structure which is opposite to the substrate (i.e., on a surface of the alternating laminate structure). The upper layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer more preferably contains a compound of: an element of at least one kind selected from the group consisting of Ti, Nb, Cr and Al; and an element of at least one kind selected from the group consisting of C, N, O and B, and further preferably contains a compound of: an element of at least one kind selected from the group consisting of Ti, Nb, Cr and Al; and N. It should be noted, however, that the upper layer is different from the compound layers in the alternating laminate structure in terms of their respective compositions. Further, the upper layer may be comprised of a single layer or multiple layers of two or more layers.

In the present embodiment, the average thickness of the upper layer is preferably from 0.1 μm or more to 3.5 μm or less because this indicates the tendency of wear resistance being excellent. From the same perspective, the average thickness of the upper layer is more preferably from 0.2 μm or more to 3.0 μm or less.

A method of manufacturing a coating layer in a coated cutting tool according to the present embodiment is not particularly limited. For example, a coating layer can be obtained by forming, in order, the compound layers in the above-described alternating laminate structure by a physical vapor deposition method, such as an ion plating method, an arc ion plating method, a sputtering method or an ion mixing method. In particular, a coating layer formed by the arc ion plating method has high adhesion with the substrate. Therefore, from among the above methods, the arc ion plating method is preferred.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reaction vessel of a physical vapor deposition apparatus, and metal evaporation sources are placed in the reaction vessel. Thereafter, the reaction vessel is evacuated until the pressure therein becomes $1.0 \times 10^{-2}$ Pa or lower, and the substrate is heated, by a heater in the reaction vessel, until the temperature becomes 600° C. or higher to 700° C. or lower. After the heating, an Ar gas is introduced into the reaction vessel so that the pressure in the reaction vessel is 0.5 Pa or higher to 5.0 Pa or lower. In the Ar gas atmosphere with a pressure of 0.5 Pa or higher to 5.0 Pa or lower, under the conditions that: a bias voltage of −350V or higher to −500V or lower is applied to the substrate; and a current of 40 A or higher to 50 A or lower is caused to flow through a tungsten filament in the reaction vessel, an ion bombardment process is carried out, with the Ar gas, on a surface of the substrate. After the ion bombardment process is carried out on the substrate surface, the reaction vessel is evacuated such that the pressure therein becomes $1.0 \times 10^{-2}$ Pa or lower.

Then, the substrate is heated so as to have a temperature of 250° C. or higher to 500° C. or lower by adjusting the temperature of the heater, and a reaction gas, such as a nitrogen gas, is then introduced in the reaction vessel. Thereafter, the pressure in the reaction vessel is set at from 2.0 Pa or higher to 4.0 Pa or lower, and a bias voltage of −60V or higher to −150V or lower is applied to the substrate. Then, a metal evaporation source according to the metal components of each layer is evaporated via an arc discharge, whereby each layer can be formed on the substrate surface. At this time, two or more kinds of metal evaporation sources which are placed at positions separate from each other are simultaneously evaporated via an arc discharge while rotating a table to which the substrate is fixed, whereby each compound layer which constitutes an alternating laminate structure can be formed. In such case, by adjusting the number of revolutions of the rotating table to which the substrate in the reaction vessel is fixed, the thickness of each compound layer which constitutes the alternating laminate structure can be controlled. Alternatively, the two or more kinds of metal evaporation sources are evaporated in an alternating manner via an arc discharge, whereby compound layers which constitute the alternating laminate structure can be formed. In such case, by adjusting the arc discharge time for each of the metal evaporation sources, the thickness of each compound layer which constitutes the alternating laminate structure can be controlled.

In order to achieve the above-mentioned predetermined size of the average grain size of the alternating laminate structure of the present embodiment, the temperature of the substrate when the alternating laminate structure is formed may be set so as to be low. More specifically, comparing the case of a substrate temperature of 300° C. and the case of a substrate temperature of 500° C., the substrate temperature of 300° C. is lower, leading to a larger average grain size of the alternating laminate structure. Further, when using a metal evaporation source which has a low atomic ratio of the Al element based on a total of the Al element and the element represented by M, this indicates the tendency of the average grain size of the alternating laminate structure being increased. Accordingly, the average grain size of the alternating laminate structure can be controlled by adjusting the substrate temperature when the alternating laminate structure is formed and the composition of the metal evaporation source.

The thickness of each layer which constitutes the coating layer in the coated cutting tool of the present embodiment can be measured, for example, from a cross-sectional structure of the coated cutting tool, using a TEM. More specifically, in the coated cutting tool, the thickness of each layer is measured from each of the cross-sectional surfaces at three or more locations near the position 50 μm off from the edge of a surface facing the metal evaporation source, toward the center of such surface. The arithmetic mean of the resulting thicknesses of the respective layers can be defined as an average thickness of the layers in the coated cutting tool.

The composition of each layer which constitutes the coating layer in the coated cutting tool of the present embodiment can be determined, from a cross-sectional structure of the coated cutting tool of the present embodiment, via measurements with the use of an energy-dispersive X-ray spectroscope (EDS), a wavelength-dispersive X-ray spectroscope (WDS), or the like.

The coated cutting tool of the present embodiment provides the effect of being capable of extending the tool life compared with the prior art. The factors for the above are not limited thereto but can be considered to derive from the coated cutting tool being excellent in terms of oxidation resistance and fracture resistance. Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

Example 1

A machined cemented carbide insert with a shape of ISO certified CNMG120408 and a composition of 93.5WC-6.2Co-0.3Cr$_3$C$_2$ (mass %) was prepared as a substrate. In a reaction vessel of an arc ion plating apparatus, a metal evaporation source was arranged so as to achieve the composition of each layer shown in Table 1. The prepared substrate was fixed to a fixation fitting of a rotating table in the reaction vessel.

Thereafter, the reaction vessel was evacuated such that the pressure therein became $5.0 \times 10^{-3}$ Pa or lower. After the evacuation, the substrate was heated by a heater in the reaction vessel so as to have a temperature of 600° C. After the heating, an Ar gas was introduced into the reaction vessel such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reaction vessel, an ion bombardment process was carried out, with the Ar gas, on a surface of the substrate for 30 minutes. After the ion bombardment process, the reaction vessel was evacuated such that the pressure therein became $5.0 \times 10^{-3}$ Pa or lower.

After the evacuation, the substrate was heated such that the temperature thereof reached the temperature in Table 2 (temperature when the step was started), a nitrogen (N$_2$) gas was introduced into the reaction vessel, and an adjustment was conducted to achieve the pressure shown in Table 2 in the reaction vessel.

Next, as to invention samples 1 to 14 and comparative samples 1 to 7, the A layers and B layers shown in Table 1 were formed in an alternating manner so as to obtain an alternating laminate structure. In further detail, the A layers and the B layers were formed in an alternating manner by simultaneously evaporating a metal evaporation source for the A layers and a metal evaporation source for the B layers via an arc discharge. At this time, the thickness of the A layer and the thickness of the B layer were controlled by adjusting the number of revolutions of the rotating table within a range of 1 rpm or more to 5 rpm or less. It should be noted that the "absolute value of a composition difference" in Table 1 refers to the "absolute value of a composition difference" between an A layer and a B layer.

Meanwhile, as to comparative sample 8, a bias voltage of −50V was applied to the substrate, and the metal evaporation source was evaporated via an arc discharge with an arc current of 120 A, whereby the single compound layer shown in Table 1 was formed.

After the formation of each layer with the predetermined average thickness shown in Table 1 on the substrate surface, the heater was turned off, and the sample was taken out of the reaction vessel after the temperature of the sample reached 100° C. or lower.

TABLE 1

| | Coating layer | | | | | | |
|---|---|---|---|---|---|---|---|
| | Alternating laminate structure | | | | | | Avg. thickness of entire coating layer (μm) |
| | A layer (Compound layer) | | B layer (Compound layer) | | Number of repeats (times) | Absolute value of composition difference (%) | |
| Sample No. | Composition | Avg. thickness (nm) | Composition | Avg. thickness (nm) | | | |
| Invention sample 1 | $(Al_{0.70}Ti_{0.30})N$ | 5 | $(Al_{0.69}Ti_{0.31})N$ | 5 | 300 | 1 | 3.00 |
| Invention sample 2 | $(Al_{0.70}Ti_{0.30})N$ | 5 | $(Al_{0.67}Ti_{0.33})N$ | 5 | 300 | 3 | 3.00 |
| Invention sample 3 | $(Al_{0.70}Ti_{0.30})N$ | 5 | $(Al_{0.67}Ti_{0.33})N$ | 5 | 150 | 3 | 1.50 |
| Invention sample 4 | $(Al_{0.70}Ti_{0.30})N$ | 5 | $(Al_{0.67}Ti_{0.33})N$ | 5 | 600 | 3 | 6.00 |
| Invention sample 5 | $(Al_{0.70}Ti_{0.30})N$ | 20 | $(Al_{0.67}Ti_{0.33})N$ | 20 | 75 | 3 | 3.00 |
| Invention sample 6 | $(Al_{0.70}Ti_{0.30})N$ | 50 | $(Al_{0.67}Ti_{0.33})N$ | 50 | 30 | 3 | 3.00 |
| Invention sample 7 | $(Al_{0.70}Ti_{0.30})N$ | 10 | $(Al_{0.67}Ti_{0.33})N$ | 5 | 200 | 3 | 3.00 |
| Invention sample 8 | $(Al_{0.67}Ti_{0.30}Hf_{0.03})N$ | 5 | $(Al_{0.65}Ti_{0.30}Hf_{0.05})N$ | 5 | 300 | 2 | 3.00 |
| Invention sample 9 | $(Al_{0.65}Ta_{0.35})N$ | 5 | $(Al_{0.61}Ta_{0.39})N$ | 5 | 300 | 4 | 3.00 |
| Invention sample 10 | $(Al_{0.60}Zr_{0.40})N$ | 5 | $(Al_{0.58}Zr_{0.42})N$ | 5 | 300 | 2 | 3.00 |
| Invention sample 11 | $(Al_{0.75}Nb_{0.25})N$ | 4 | $(Al_{0.71}Nb_{0.29})N$ | 4 | 375 | 4 | 3.00 |
| Invention sample 12 | $(Al_{0.80}Cr_{0.20})N$ | 2 | $(Al_{0.77}Cr_{0.23})N$ | 3 | 600 | 3 | 3.00 |
| Invention sample 13 | $(Al_{0.80}Cr_{0.20})N$ | 2 | $(Al_{0.77}Cr_{0.23})N$ | 3 | 2500 | 3 | 12.50 |
| Invention sample 14 | $(Al_{0.70}Cr_{0.20}Si_{0.10})N$ | 2 | $(Al_{0.67}Cr_{0.20}Si_{0.13})N$ | 3 | 600 | 3 | 3.00 |
| Comparative sample 1 | $(Al_{0.70}Ti_{0.30})N$ | 5 | $(Al_{0.60}Ti_{0.40})N$ | 5 | 300 | 10 | 3.00 |
| Comparative sample 2 | $(Al_{0.50}Ti_{0.50})N$ | 5 | $(Al_{0.30}Ti_{0.70})N$ | 5 | 300 | 20 | 3.00 |
| Comparative sample 3 | $(Al_{0.60}Ti_{0.40})N$ | 5 | TiN | 5 | 300 | 60 | 3.00 |
| Comparative sample 4 | $(Al_{0.70}Cr_{0.30})N$ | 100 | $(Al_{0.65}Cr_{0.35})N$ | 100 | 15 | 5 | 3.00 |
| Comparative sample 5 | $(Al_{0.65}Ti_{0.35})N$ | 200 | $(Al_{0.62}Ti_{0.38})N$ | 300 | 6 | 3 | 3.00 |
| Comparative sample 6 | $(Al_{0.53}Ti_{0.47})N$ | 20 | $(Al_{0.51}Ti_{0.49})N$ | 20 | 75 | 2 | 3.00 |
| Comparative sample 7 | $(Al_{0.85}Ti_{0.15})N$ | 3 | $(Al_{0.81}Ti_{0.19})N$ | 3 | 500 | 4 | 3.00 |
| Comparative sample 8 | | | $(Al_{0.70}Ti_{0.30})N$ (Single layer) | | | | 3.00 |

TABLE 2

| Sample No. | Substrate temperature (° C.) | Pressure in reaction vessel (Pa) |
|---|---|---|
| Invention sample 1 | 400 | 2.5 |
| Invention sample 2 | 350 | 4.0 |
| Invention sample 3 | 400 | 3.0 |
| Invention sample 4 | 250 | 3.5 |
| Invention sample 5 | 350 | 3.0 |
| Invention sample 6 | 350 | 2.5 |
| Invention sample 7 | 300 | 3.5 |
| Invention sample 8 | 250 | 3.5 |
| Invention sample 9 | 300 | 4.5 |
| Invention sample 10 | 300 | 5.0 |
| Invention sample 11 | 400 | 2.5 |
| Invention sample 12 | 400 | 3.0 |
| Invention sample 13 | 400 | 3.5 |
| Invention sample 14 | 450 | 2.0 |
| Comparative sample 1 | 250 | 4.0 |
| Comparative sample 2 | 400 | 3.0 |

TABLE 2-continued

| Sample No. | Substrate temperature (° C.) | Pressure in reaction vessel (Pa) |
|---|---|---|
| Comparative sample 3 | 350 | 3.0 |
| Comparative sample 4 | 350 | 4.0 |
| Comparative sample 5 | 300 | 3.0 |
| Comparative sample 6 | 350 | 3.5 |
| Comparative sample 7 | 350 | 3.0 |
| Comparative sample 8 | 450 | 2.5 |

As to the average thickness of each layer of each of the obtained samples, such average thickness was obtained by: measuring the thickness of each layer via a TEM observation of each of the cross-sectional surfaces at three locations near the position 50 μm off from the edge of a surface facing the metal evaporation source of the coated cutting tool, toward the center of such surface; and calculating the arithmetic mean of the resulting measurements. The composition of each layer of the obtained sample was measured from the cross-sectional surface near the position at most 50 μm off from the edge of a surface facing the metal evaporation source of the coated cutting tool, toward the center of such surface, using an EDS. The measurement results are shown in Table 1. It should be noted that the composition ratio of the metal elements of each layer in Table 1 refers to an atomic ratio of each metal element relative to all the metal elements in the compound which constitutes each layer.

The average grain size of the alternating laminate structure of the obtained sample was obtained as set forth below. Firstly, a cross-sectional structure of the coated cutting tool was observed with the TEM, and an image magnified 60,000 times was taken. A line (with a width equal to 200 nm) parallel with the substrate surface was drawn on the taken image so as to traverse the structure of the alternating laminate structure. The value obtained by dividing the length (diameter) of the particles included in the line by the number of particles contained on the line was regarded as a grain size of the alternating laminate structure. Five lines were drawn, and, as to such respective lines, grain sizes of the alternating laminate structure were measured. The arithmetic mean of the obtained grain sizes of the alternating laminate structure was calculated, and the resulting value was defined as an average grain size of the alternating laminate structure. The results are shown in Table 3.

TABLE 3

| Sample No. | Alternating laminate structure Average grain size (nm) |
|---|---|
| Invention sample 1 | 130 |
| Invention sample 2 | 204 |
| Invention sample 3 | 140 |
| Invention sample 4 | 250 |
| Invention sample 5 | 185 |
| Invention sample 6 | 170 |
| Invention sample 7 | 220 |
| Invention sample 8 | 262 |
| Invention sample 9 | 330 |
| Invention sample 10 | 420 |
| Invention sample 11 | 115 |
| Invention sample 12 | 105 |
| Invention sample 13 | 120 |
| Invention sample 14 | 78 |
| Comparative sample 1 | 380 |
| Comparative sample 2 | 504 |
| Comparative sample 3 | 650 |
| Comparative sample 4 | 200 |
| Comparative sample 5 | 230 |
| Comparative sample 6 | 500 |
| Comparative sample 7 | 38 |
| Comparative sample 8 | 100 |

Using the obtained samples, the following cutting test was conducted for performing evaluations.

[Cutting Test]
Workpiece: Inconel 718
Workpiece shape: a cylinder of φ150 mm×300 mm
Cutting rate: 60 m/min
Feed: 0.15 mm/rev
Depth of cut: 0.8 mm
Coolant: used
Evaluation items: A time when a sample was fractured (chipping occurred in the cutting edge of a sample) or had a flank wear width of 0.3 mm was defined as the end of the tool life, and the machining time to reach the end of the tool life was measured. The damage form in the former case was regarded as "fracturing," and the damage form in the latter case was regarded as "normal wear."

The results of the cutting test are shown in Table 4.

TABLE 4

| | Cutting test | |
|---|---|---|
| Sample No. | Machining time (min) | Damage form |
| Invention sample 1 | 47 | Normal wear |
| Invention sample 2 | 51 | Normal wear |
| Invention sample 3 | 42 | Normal wear |
| Invention sample 4 | 43 | Normal wear |

TABLE 4-continued

| | Cutting test | |
|---|---|---|
| Sample No. | Machining time (min) | Damage form |
| Invention sample 5 | 48 | Normal wear |
| Invention sample 6 | 46 | Normal wear |
| Invention sample 7 | 50 | Normal wear |
| Invention sample 8 | 44 | Normal wear |
| Invention sample 9 | 42 | Normal wear |
| Invention sample 10 | 41 | Normal wear |
| Invention sample 11 | 46 | Normal wear |
| Invention sample 12 | 43 | Normal wear |
| Invention sample 13 | 40 | Normal wear |
| Invention sample 14 | 40 | Normal wear |
| Comparative sample 1 | 30 | Fracturing |
| Comparative sample 2 | 25 | Fracturing |
| Comparative sample 3 | 18 | Fracturing |
| Comparative sample 4 | 35 | Normal wear |
| Comparative sample 5 | 33 | Normal wear |
| Comparative sample 6 | 17 | Fracturing |
| Comparative sample 7 | 25 | Normal wear |
| Comparative sample 8 | 22 | Normal wear |

Comparative samples 1 to 3 each involve a great absolute value of the composition difference and, in turn, involves a large amount of distortion in the coating layer, resulting in the occurrence of fracturing. In particular, comparative sample 3, which involves a small content of Al in the B layer, results in the occurrence of fracturing in an early stage because the progress of oxidation reduced the strength of the edge. For the same reason, comparative sample 6, which involves a small content of Al in each of the A layer and the B layer, results in the occurrence of fracturing in an early stage. Comparative examples 4 and 5 each involve a shorter tool life than that involved in each invention sample because a great thickness of each of the compound layers reduced the hardness of the coating layer. Comparative samples 7 and 8 each involve a large flank wear width in an early stage.

The results of Table 4 indicate that the machining time of each invention sample is longer than the machining time of each comparative sample. Therefore, it is apparent that the invention samples each involve a longer tool life. The factors for the above can be considered to derive from the invention samples being excellent in terms of both oxidation resistance and fracture resistance, but the factors are not limited thereto.

Example 2

A machined cemented carbide insert with a shape of ISO certified CNMG120408 and a composition of 93.5WC-6.2Co-0.3Cr$_3$C$_2$ (mass %) was prepared as a substrate. In a reaction vessel of an arc ion plating apparatus, a metal evaporation source was arranged so as to achieve the composition of each layer shown in Table 5. The prepared substrate was fixed to a fixation fitting of a rotating table in the reaction vessel.

Thereafter, the reaction vessel was evacuated such that the pressure therein became $5.0 \times 10^{-3}$ Pa or lower. After the evacuation, the substrate was heated by a heater in the reaction vessel so as to have a temperature of 600° C. After the heating, an Ar gas was introduced into the reaction vessel such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reaction vessel, an ion bombardment process was carried out, with the Ar gas, on a surface of the substrate for 30 minutes. After the ion bombardment process, the reaction vessel was evacuated such that the pressure therein became $5.0 \times 10^{-3}$ Pa or lower.

After the evacuation, the substrate was heated such that the temperature thereof reached the temperature in Table 6 (temperature when the step was started), a nitrogen (N$_2$) gas was introduced into the reaction vessel, and an adjustment was conducted to achieve the pressure shown in Table 6 in the reaction vessel.

Then, the lower layer was formed, as shown in Table 5, for each of invention samples 15 to 18. In further detail, a bias voltage of −50V was applied to the substrate, and the metal evaporation source was evaporated via an arc discharge with an arc current of 120 A, whereby the lower layer was formed.

Next, as to invention samples 15 to 18, the A layers and B layers shown in Table 5 were formed in an alternating manner so as to obtain an alternating laminate structure. In further detail, under the conditions shown in FIG. 6, the A layers and the B layers were formed in an alternating manner by simultaneously evaporating a metal evaporation source for the A layers and a metal evaporation source for the B layers via an arc discharge. At this time, the thickness of the A layer and the thickness of the B layer were controlled by adjusting the number of revolutions of the rotating table within a range of 1 rpm or more to 5 rpm or less. It should be noted that the "absolute value of a composition difference" in Table 5 refers to the "absolute value of a composition difference" between an A layer and a B layer.

After the formation of the alternating laminate structure, a bias voltage of −50V was applied to the substrate, and the metal evaporation source was evaporated via an arc discharge with an arc current of 120 A, whereby the upper layer shown in Table 5 was formed.

After the formation of each layer with the predetermined thickness shown in Table 5 on the substrate surface, the heater was turned off, and the sample was taken out of the reaction vessel after the temperature of the sample reached 100° C. or lower.

TABLE 5

| | Coating layer | | | | | |
|---|---|---|---|---|---|---|
| | Lower layer | | Alternating laminate structure | | | |
| | | | A layer | | B layer | |
| Sample No. | Composition | Avg. thickness (nm) | Composition | Avg. thickness (nm) | Composition | Avg. thickness (nm) |
| Invention sample 15 | $(Al_{0.50}Ti_{0.50})N$ | 0.5 | $(Al_{0.65}Ti_{0.35})N$ | 10 | $(Al_{0.61}Ti_{0.39})N$ | 10 |
| Invention sample 16 | $(Al_{0.67}Ti_{0.33})N$ | 0.5 | $(Al_{0.70}Ti_{0.20}Mo_{0.10})N$ | 5 | $(Al_{0.67}Ti_{0.20}Mo_{0.13})N$ | 5 |
| Invention sample 17 | $(Al_{0.70}Ti_{0.30})N$ | 0.2 | $(Al_{0.80}Ti_{0.15}W_{0.05})N$ | 2 | $(Al_{0.77}Ti_{0.15}W_{0.08})N$ | 2 |
| Invention sample 18 | TiN | 0.1 | $(Al_{0.60}Ti_{0.30}V_{0.10})N$ | 30 | $(Al_{0.58}Ti_{0.30}V_{0.12})N$ | 30 |

| | Coating layer | | | | | |
|---|---|---|---|---|---|---|
| | Alternating laminate structure | | | Upper layer | | Avg. thickness |
| Sample No. | Number of repeats (times) | Absolute value of composition difference (%) | Avg. thickness of entire alternating laminate structure (μm) | Composition | Avg. thickness (μm) | of entire coating layer (μm) |
| Invention sample 15 | 120 | 4 | 2.40 | $(Al_{0.80}Nb_{0.20})N$ | 0.2 | 3.10 |
| Invention sample 16 | 220 | 3 | 2.20 | $(Al_{0.70}Ti_{0.30})N$ | 0.5 | 3.20 |
| Invention sample 17 | 600 | 3 | 2.40 | $(Al_{0.80}Ti_{0.20})N$ | 1 | 3.60 |
| Invention sample 18 | 50 | 2 | 3.00 | $(Al_{0.75}Cr_{0.25})N$ | 3 | 6.10 |

TABLE 6

| Sample No. | Substrate temperature (° C.) | Pressure in reaction vessel (Pa) |
|---|---|---|
| Invention sample 15 | 250 | 3.5 |
| Invention sample 16 | 350 | 4.0 |
| Invention sample 17 | 400 | 3.5 |
| Invention sample 18 | 300 | 4.5 |

As to the average thickness of each layer of each of the obtained samples, such average thickness was obtained by: measuring the thickness of each layer via a TEM observation of each of the cross-sectional surfaces at three locations near the position 50 μm off from the edge of a surface facing the metal evaporation source of the coated cutting tool, toward the center of such surface; and calculating the arithmetic mean of the resulting measurements. The composition of each layer of the obtained sample was measured from the cross-sectional surface near the position at most 50 μm off from the edge of a surface facing the metal evaporation source of the coated cutting tool, toward the center of such surface, using an EDS. The measurement results are shown in Table 5. It should be noted that the composition ratio of the metal elements of each layer in Table 5 refers to an atomic ratio of each metal element relative to all the metal elements in the compound which constitutes each layer.

The average grain size of the alternating laminate structure of the obtained sample was obtained as set forth below. Firstly, a cross-sectional structure of the coated cutting tool was observed with the TEM, and an image magnified 60,000 times was taken. A line (with a width equal to 200 nm) parallel with the substrate surface was drawn on the taken image so as to traverse the structure of the alternating laminate structure. The value obtained by dividing the length (diameter) of the particles included in the line by the number of particles contained on the line was regarded as a grain size of the alternating laminate structure. Five lines were drawn, and, as to such respective lines, grain sizes of the alternating laminate structure were measured. The arithmetic mean of the obtained grain sizes of the alternating laminate structure was calculated, and the resulting value was defined as an average grain size of the alternating laminate structure. The results are shown in Table 7.

TABLE 7

| Sample No. | Alternating laminate structure Average grain size (nm) |
|---|---|
| Invention sample 15 | 250 |
| Invention sample 16 | 200 |
| Invention sample 17 | 120 |
| Invention sample 18 | 350 |

Using the obtained samples, the cutting test was conducted, as shown in Example 1, for performing evaluations. The results of the cutting test are shown in Table 8.

TABLE 8

| Sample No. | Cutting test | |
|---|---|---|
| | Machining time (min) | Damage form |
| Invention sample 15 | 47 | Normal wear |
| Invention sample 16 | 53 | Normal wear |
| Invention sample 17 | 44 | Normal wear |
| Invention sample 18 | 42 | Normal wear |

The results of Table 8 indicate that the machining time of each invention sample is longer than the machining time of each comparative sample shown in Table 4. Therefore, it is apparent that the invention samples each involve a longer tool life even if they each include the upper layer and the lower layer. The factors for the above can be considered to derive from the invention samples being excellent in terms of both oxidation resistance and fracture resistance, but the factors are not limited thereto.

INDUSTRIAL APPLICABILITY

As to a coated cutting tool according to the present invention, since such coated cutting tool has excellent fracture resistance and since the tool life can be extended more than that involved in the prior art, the coated cutting tool has high industrial applicability.

REFERENCE SIGNS LIST

1: Substrate, 2: Lower layer, 3: A layer, 4: B layer, 5: Upper layer, 6: Alternating laminate structure, 7: Coating layer, 8: Coated cutting tool.

What is claimed is:
1. A coated cutting tool comprising a substrate and a coating layer formed on a surface of the substrate, the coating layer including an alternating laminate structure in which two or more compound layers of each of two or three or more kinds, each kind having a different composition, are laminated in an alternating manner, wherein:
the alternating laminate structure is constituted by:
a compound layer containing a compound having a composition represented by formula (1) below:

$$(Al_xM_{1-x})N \quad (1)$$

wherein M denotes an element of at least one kind selected from the group consisting of Ti, Zr, Hf, V, Nb, Ta, Cr, Mo, W and Si, x denotes an atomic ratio of the Al element based on a total of the Al element and an element denoted by M, and x satisfies 0.58≤x≤0.80; and
a compound layer containing a compound having a composition represented by formula (2) below:

$$(Al_yM_{1-y})N \quad (2)$$

wherein M denotes an element of at least one kind selected from the group consisting of Ti, Zr, Hf, V, Nb, Ta, Cr, Mo, W and Si, y denotes an atomic ratio of the Al element based on a total of the Al element and an element denoted by M, and y satisfies 0.57≤x≤0.79;

an absolute value of a difference between an amount of a specific metal element contained in a compound layer which constitutes the alternating laminate structure relative to an amount of all the metal elements contained therein and an amount of the specific metal element contained in another compound layer which is adjacent to the compound layer and which constitutes the alternating laminate structure relative to an amount of all the metal elements contained therein, is from 1 atom % or higher to 4 atom % or lower; and
an average thickness of each of the compound layers is from 1 nm or more to 50 nm or less, and an average thickness of the alternating laminate structure is from 1.5 µm or more to 15.0 µm or less.

2. The coated cutting tool according to claim 1, wherein an average grain size of the alternating laminate structure is from 100 nm or more to 450 nm or less.

3. The coated cutting tool according to claim 1, wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 µm or more to 3.5 µm or less.

4. The coated cutting tool according to claim 1, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 µm or more to 3.5 µm or less.

5. The coated cutting tool according to claim 1, wherein an average thickness of the coating layer in its entirety is from 1.5 µm or more to 15 µm or less.

6. The coated cutting tool according to claim 1, wherein the substrate is a cemented carbide, cermet, ceramics or a cubic boron nitride sintered body.

7. The coated cutting tool according to claim 2, wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 µm or more to 3.5 µm or less.

8. The coated cutting tool according to claim 2, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 µm or more to 3.5 µm or less.

9. The coated cutting tool according to claim 3, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

10. The coated cutting tool according to claim 2, wherein an average thickness of the coating layer in its entirety is from 1.5 μm or more to 15 μm or less.

11. The coated cutting tool according to claim 3, wherein an average thickness of the coating layer in its entirety is from 1.5 μm or more to 15 μm or less.

12. The coated cutting tool according to claim 4, wherein an average thickness of the coating layer in its entirety is from 1.5 μm or more to 15 μm or less.

13. The coated cutting tool according to claim 2, wherein the substrate is a cemented carbide, cermet, ceramics or a cubic boron nitride sintered body.

14. The coated cutting tool according to claim 3, wherein the substrate is a cemented carbide, cermet, ceramics or a cubic boron nitride sintered body.

* * * * *